United States Patent
Sforzin et al.

(10) Patent No.: US 11,158,363 B2
(45) Date of Patent: Oct. 26, 2021

(54) REFRESH IN MEMORY BASED ON MONITOR ARRAY THRESHOLD DRIFT

(71) Applicant: Micron Technology, Inc., Boise, ID (US)

(72) Inventors: Marco Sforzin, Cernusco Sul Naviglio (IT); Paolo Amato, Treviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/110,601

(22) Filed: Aug. 23, 2018

(65) Prior Publication Data

US 2018/0366177 A1     Dec. 20, 2018

Related U.S. Application Data

(63) Continuation of application No. 15/590,143, filed on May 9, 2017, now Pat. No. 10,147,475.

(51) Int. Cl.
| | | |
|---|---|---|
| *G11C 16/10* | (2006.01) | |
| *G11C 11/406* | (2006.01) | |
| *G05F 3/26* | (2006.01) | |
| *G11C 16/04* | (2006.01) | |
| *G11C 16/34* | (2006.01) | |

(Continued)

(52) U.S. Cl.
CPC ........... *G11C 11/406* (2013.01); *G05F 3/26* (2013.01); *G11C 11/40607* (2013.01); *G11C 13/0033* (2013.01); *G11C 13/0061* (2013.01); *G11C 16/0483* (2013.01); *G11C 16/10* (2013.01); *G11C 16/32* (2013.01); *G11C 16/349* (2013.01); *G11C 16/3418* (2013.01); *G11C 2207/104* (2013.01); *G11C 2211/4062* (2013.01)

(58) Field of Classification Search
CPC ... G11C 11/406; G11C 16/32; G11C 13/0061; G11C 16/3418; G11C 13/0033; G11C 16/349; G11C 16/10; G11C 16/0483; G11C 11/40607; G11C 2207/104; G11C 2211/4062; G05F 3/26
See application file for complete search history.

(56) References Cited

U.S. PATENT DOCUMENTS

| | | | |
|---|---|---|---|
| 6,714,473 B1 * | 3/2004 | Fiscus ................. | G11C 7/04 365/185.24 |
| 7,961,516 B2 | 6/2011 | Isobe | |
| 9,437,290 B2 | 9/2016 | Lee et al. | |

(Continued)

FOREIGN PATENT DOCUMENTS

| | | |
|---|---|---|
| KR | 10-2009-0060185 A | 6/2009 |
| KR | 10-2016-02011488 A | 2/2016 |

OTHER PUBLICATIONS

International Search Report and Written Opinion from related International patent application No. PCT/US2018/031015, dated Sep. 7, 2018, 11 pp.

(Continued)

*Primary Examiner* — Mushfique Siddique
(74) *Attorney, Agent, or Firm* — Brooks, Cameron & Huebsch, PLLC (57) ABSTRACT

The present disclosure includes apparatuses and methods related to refresh in memory. An example apparatus can refresh an array of memory cells in response to a portion of memory cells in an array having threshold voltages that are greater than a reference voltage.

19 Claims, 4 Drawing Sheets

(51) Int. Cl.
  *G11C 13/00* (2006.01)
  *G11C 16/32* (2006.01)

(56) References Cited

U.S. PATENT DOCUMENTS

| | | | |
|---|---|---|---|
| 9,824,767 B1* | 11/2017 | Mantegazza | G11C 16/10 |
| 10,373,679 B1* | 8/2019 | Lee | G11C 13/047 |
| 2004/0022085 A1 | 2/2004 | Parkinson et al. | |
| 2005/0105333 A1* | 5/2005 | Park | G11C 29/50 |
| | | | 365/185.17 |
| 2007/0253238 A1* | 11/2007 | Resta | G11C 11/2275 |
| | | | 365/148 |
| 2008/0151669 A1 | 6/2008 | Bill et al. | |
| 2008/0175055 A1* | 7/2008 | Kim | G11C 16/3418 |
| | | | 365/185.11 |
| 2009/0147581 A1 | 6/2009 | Isobe | |
| 2009/0303785 A1* | 12/2009 | Hwang | G11C 5/147 |
| | | | 365/163 |
| 2009/0323449 A1* | 12/2009 | Kim | G11C 11/40615 |
| | | | 365/222 |
| 2010/0321987 A1 | 12/2010 | Lung et al. | |
| 2011/0013446 A1 | 1/2011 | Lung | |
| 2012/0063196 A1* | 3/2012 | Kim | G11C 13/0004 |
| | | | 365/148 |
| 2012/0075914 A1 | 3/2012 | Bateman et al. | |
| 2012/0075924 A1* | 3/2012 | Kau | G11C 13/0061 |
| | | | 365/163 |
| 2012/0294092 A1 | 11/2012 | Cho et al. | |
| 2013/0111298 A1 | 5/2013 | Seroff et al. | |
| 2013/0198436 A1 | 8/2013 | Bandic et al. | |
| 2013/0336047 A1 | 12/2013 | Hokenmaier | |
| 2014/0325310 A1 | 10/2014 | Anholt et al. | |
| 2015/0052394 A1* | 2/2015 | Sunwoo | G06F 11/10 |
| | | | 714/16 |
| 2015/0103589 A1* | 4/2015 | Lee | G11C 11/5678 |
| | | | 365/163 |
| 2015/0371712 A1* | 12/2015 | Mokhlesi | G11C 16/26 |
| | | | 365/185.18 |
| 2016/0284399 A1 | 9/2016 | Mantegazza et al. | |
| 2016/0351266 A1 | 12/2016 | Kim et al. | |

OTHER PUBLICATIONS

Notice of Preliminary Rejection from related Korean patent application No. 10-2019-7035937, dated Oct. 26, 2020, 8 pages.
Search Report from related European patent application No. 18799373.8, dated Dec. 15, 2020, 9 pages.
Korean Notice of Last Preliminary Rejection for related Korean Patent Application No. 10-2019-7035937, dated Apr. 21, 2021, 10 pages.

* cited by examiner

REFRESH IN MEMORY BASED ON MONITOR ARRAY THRESHOLD DRIFT

PRIORITY INFORMATION

This application is a Continuation of U.S. application Ser. No. 15/590,143, filed May 9, 2017, the contents of which are included herein by reference.

TECHNICAL FIELD

The present disclosure relates generally to memory devices, and more particularly, to apparatuses and methods for refresh in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory system used in computing devices. Memory systems can include volatile, such as DRAM, for example, and/or non-volatile memory, such as Flash memory or RRAM, for example.

DETAILED DESCRIPTION

The present disclosure includes apparatuses and methods related to refresh in memory. An example apparatus can refresh an array of memory cells in response to a portion of memory cells in the array having threshold voltages that are greater than a reference voltage.

In one or more embodiments of the present disclosure, a controller can be configured to refresh an array of memory cells in response to a portion of memory cells in the array having threshold voltages that are greater than a reference voltage. The controller can be configured to refresh memory cells programmed to a first state and/or to a second state, for example. The controller can also be configured to apply a current to a portion of the array of memory cells and measure the voltages of the portion of the array of memory cells. The current can be applied during set periods of time (e.g., periodically) or can be applied continuously. The controller can be configured to refresh the memory cells in the array in response to the portion of the array of memory cells having threshold voltages that are greater than the reference voltage. A refresh operation can include reprogramming the memory cells to the state which they had been previously programmed. Refreshing the array of memory cells can improve read margin of the array of memory cells.

In one or more embodiments of the present disclosure, the controller is configured to measure a voltage associated with a portion of memory cells (e.g., a monitor array of memory cells) in the array of memory cells and refresh the array of memory cells in response to the voltage being within a set margin of a reference voltage. The threshold voltage associated with memory cells can change over time reducing and/or eliminating a read margin associated with adjacent data states. Therefore, according to embodiments of the present disclosure a refresh operation can be used to reestablish the read margins associated with adjacent data states. The portion of memory cells can be connected in parallel. In one or more embodiments, the number of memory cells in the monitor array can depend on a reference voltage.

In one or more embodiments, another array of memory cells can be used to store data during the refresh operation. The controller can include, for example, a buffer that stores the data during the refresh operation. In one or more embodiments, the memory device can include a buffer that stores the data during the refresh operation. Also, another memory device, such as a NAND flash memory device, can be used to store data during the refresh operation.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more of such things. For example, a number of memory devices can refer to one or more of memory devices. Additionally, designators such as "M", "N", "S", "T", "X", "Y", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Figure 1A:
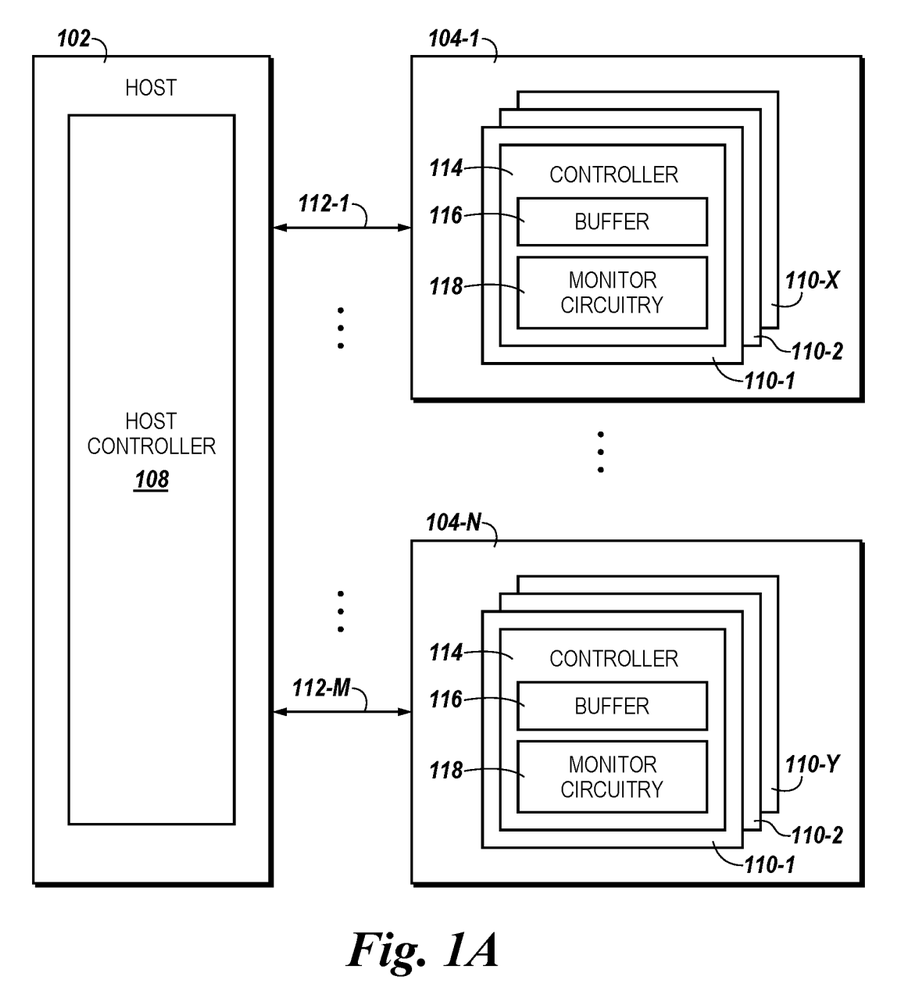
FIG. 1A is a block diagram of an apparatus in the form of a computing system including a memory system in accordance with a number of embodiments of the present disclosure.

FIG. 1A is a functional block diagram of a computing system 100 including an apparatus in the form of a number of memory systems 104-1 . . . 104-N, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1A, memory systems 104-1 . . . 104-N can include one or more memory devices, such as memory devices 110-1, . . . , 110-X, 110-Y. Memory devices 110-1, . . . , 110-X, 110-Y can include volatile memory and/or non-volatile memory. In a number of embodiments, memory systems 104-1, . . . , 104-N can include a multi-chip device. A multi-chip device can include a number of different memory types. For example, a memory system can include a number of chips having non-volatile or volatile memory on any type of a module. In FIG. 1A, memory system 104-1 is coupled to the host 102 via channels 112-1 can include memory devices 110-1, . . . , 110-X. For example, memory device 110-1 can be a non-volatile cross-point array memory device and 110-X can be a NAND flash memory device. In this example, each memory device 110-1, . . . , 110-X, 110-Y includes a controller 114. Controller 114 can receive commands from host 102 and control execution of the commands on a memory device. The host 102 can send commands to the memory devices 110-1, . . . , 110-X, 110-Y. For example, the host can communicate on the same channel (e.g., channel 112-1) with a non-volatile cross-point array memory device and a NAND flash memory device that are both on the same memory system.

As illustrated in FIG. 1A, a host 102 can be coupled to the memory systems 104-1 . . . 104-N. In a number of embodiments, each memory system 104-1 . . . 104-N can be coupled to host 102 via a channel. In FIG. 1A, memory system 104-1 is coupled to host 102 via channel 112-1 and memory system 104-N is coupled to host 102 via channel 112-N. Host 102 can be a laptop computer, personal computers, digital camera, digital recording and playback device, mobile telephone, PDA, memory card reader, interface hub, among other host systems, and can include a memory access device (e.g., a processor). One of ordinary skill in the art will appreciate that "a processor" can intend one or more processors, such as a parallel processing system, a number of coprocessors, etc.

Host 102 includes a host controller 108 to communicate with memory systems 104-1 . . . 104-N. The host controller 108 can send commands to the memory devices 110-1, . . . , 110-X, 110-Y via channels 112-1 . . . 112-N. The host controller 108 can communicate with the memory devices 110-1, . . . , 110-X, 110-Y and/or the controller 114 on each of the memory devices 110-1, . . . , 110-X, 110-Y to read, write, and erase data, among other operations. A physical host interface can provide an interface for passing control, address, data, and other signals between the memory systems 104-1 . . . 104-N and host 102 having compatible receptors for the physical host interface. The signals can be communicated between host 102 and memory devices 110-1, . . . , 110-X, 110-Y on a number of buses, such as a data bus and/or an address bus, for example, via channels 112-1 . . . 112-N.

The host controller 108 and/or controller 114 on a memory device can include control circuitry (e.g., hardware, firmware, and/or software). In one or more embodiments, the host controller 108 and/or controller 114 can be an application specific integrated circuit (ASIC) coupled to a printed circuit board including a physical interface. Also, each memory device 110-1, . . . , 110-X, 110-Y can include buffer 116 of volatile and/or non-volatile memory. Buffer 116 can be used to buffer data that is used during execution of read commands and/or write commands. The buffer 116 can be configured to store signals, address signals (e.g., read and/or write commands), and/or data (e.g., write data). The buffer can temporarily store signals and/or data while commands are executed.

The memory devices 110-1, . . . , 110-X, 110-Y can provide main memory for the memory system or could be used as additional memory or storage throughout the memory system. Each memory device 110-1, . . . , 110-X, 110-Y can include one or more arrays of memory cells (e.g., non-volatile memory cells). The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The embodiment of FIG. 1A can include additional circuitry that is not illustrated so as not to obscure embodiments of the present disclosure. For example, the memory systems 104-1 . . . 104-N can include address circuitry to latch address signals provided over I/O connections through I/O circuitry. Address signals can be received and decoded by a row decoder and a column decoder to access the memory devices 110-1, . . . , 110-X, 110-Y. It will be appreciated by those skilled in the art that the number of address input connections can depend on the density and architecture of the memory devices 110-1, . . . , 110-X, 110-Y.

Figure 1B:
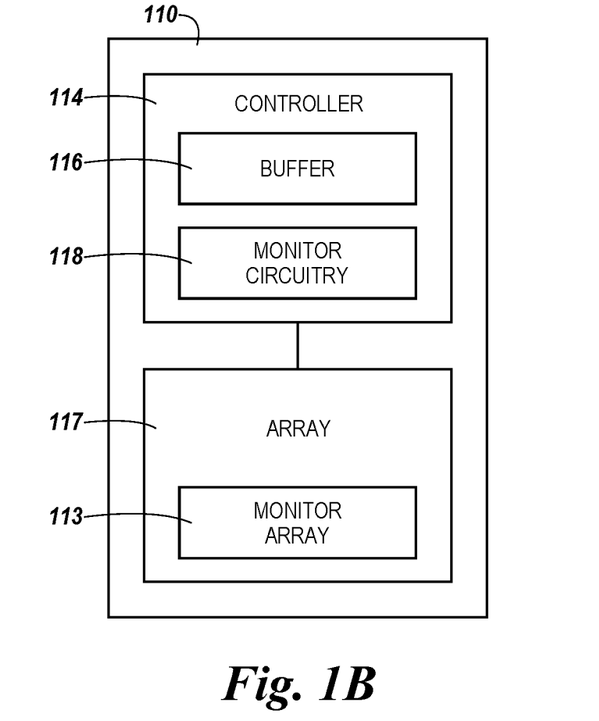
FIG. 1B is a block diagram of an apparatus in the form of a memory device in accordance with a number of embodiments of the present disclosure.

FIG. 1B is a block diagram of an apparatus in the form of a memory device in accordance with a number of embodiments of the present disclosure. In FIG. 1B, memory device 110 can include a controller 114 and an array of memory cells 117. Controller 114 can include monitor circuitry 118 and/or memory, such as SRAM memory, that can be a buffer 116. The array 117 can include one or more arrays of memory cells. The one or more arrays can be non-volatile memory arrays and/or volatile memory arrays. The array 117 can include a monitor array 113. The monitor array 113 can include memory cells coupled together in parallel via a bit line. In a number of embodiments, a current can be applied to the monitor array 113 to measure a voltage associated with the monitor array 113. The array 117 and the monitor array 113 can be refreshed in response to the voltage being within a set margin of a reference voltage.

Array 117 and/or monitor array 113 can include buffers which can be used to store cell data during a refresh operation. The buffer can receive commands from controller 114 and the monitor circuitry 118 can be configured to execute commands to apply the current to the monitor array 113.

Figure 2:
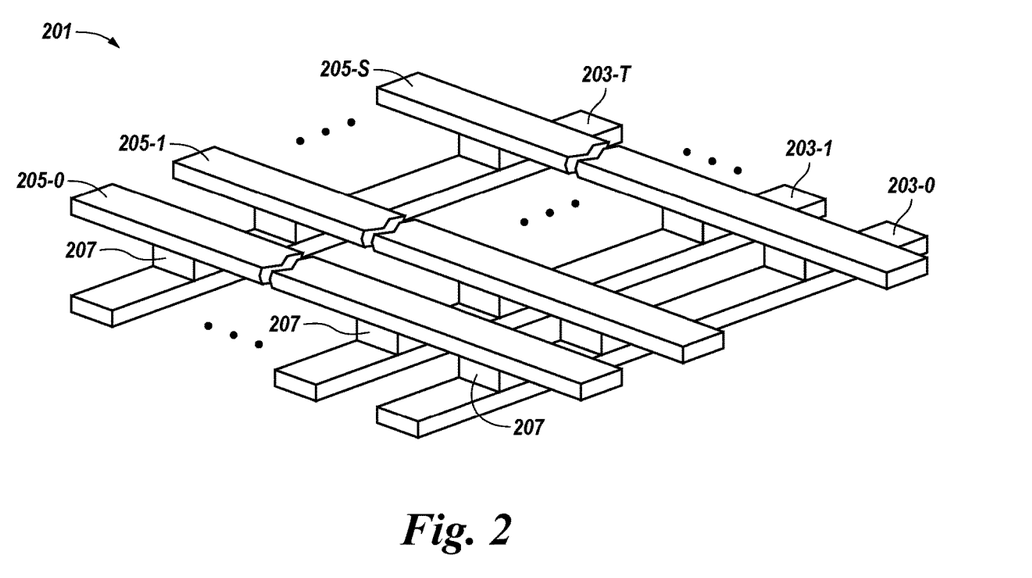
FIG. 2 is a block diagram of a portion of an array of memory cells in accordance with a number of embodiments of the present disclosure.

FIG. 2 is a block diagram of a portion of an array 201 of memory cells 207 in accordance with a number of embodiments of the present disclosure. The array 201 can be a two terminal cross-point array having memory cells 207 located at the intersections of a first plurality of conductive lines (e.g., access lines) 203-0, 203-1, . . . , 203-T, which may be referred to herein as word lines, and a second plurality of conductive lines (e.g., data/sense lines, 205-0, 205-1, . . . , 205-M) which may be referred to herein as bit lines. The designators N and M can have various values. Embodiments are not limited to a particular number of word lines and/or bit lines. As illustrated, the word lines 203-0, 203-1, . . . , 203-T are parallel to each other and are orthogonal to the bit lines 205-0, 205-1, . . . , 205-S, which are substantially parallel to each other; however, embodiments are not so limited. The conductive lines can include conductive material (e.g., a metal material). Examples of the conductive material include, but are not limited to, tungsten, copper, titanium, aluminum, and/or combinations thereof, among other conductive materials.

Each memory cell 207 may include a memory element (e.g., a resistive memory element) coupled in series with a select device (e.g., an access device) in accordance with a number of embodiments described herein. The memory element and the select device are discussed further herein.

The select devices can be operated (e.g., turned on/off) to select/deselect the memory element in order to perform operations such as data programming (e.g., writing, and/or data sensing (e.g., reading operations)). The select device can be a diode, a bipolar junction transistor, a MOS transistor, and/or an Ovonic threshold switch, among other devices. In operation, appropriate voltage and/or current signals (e.g., pulses) can be applied to the bit lines and word lines in order to program data to and/or read data from the memory cells 207. The memory cells 207 can be programmed to a set state (e.g., low resistance) or a reset state (e.g., high resistance). As an example, the data stored by a memory cell 207 of array 201 can be determined by turning on a select device and sensing a current through the memory element. The current sensed on the bit line corresponding to the memory cell 207 being read corresponds to a resistance level of the memory element (e.g., a resistance level of a resistance variable material) which in turn may correspond to a particular data state (e.g., a binary value). The array 201 can have an architecture other than that illustrated in FIG. 2, as will be understood by one of ordinary skill in the art.

The array 201 can be a two dimensional array. For example, the memory cells 207 of the array 201 can be arranged between the access lines, 203-0, 203-1, . . . , 203-T and the data/sense lines, 205-0, 205-1, . . . , 205-S in a single level. The array 201 can be a three dimensional array. For example, the memory cells of the array can be arranged in multiple levels, where each of the multiple levels has memory cells organized in a cross point architecture. For three dimensional array embodiments of the present disclosure, a vertical string of memory cells can be coupled to a data line and a plurality of access lines coupled to the vertical string of memory cells, for instance.

The access lines 203-0, 203-1, . . . , 203-T and the data/sense lines 205-0, 205-1, . . . , 205-S can be coupled to decoding circuits formed in a substrate material (e.g., formed adjacent to or for example below) the array 201 and used to interpret various signals (e.g., voltages and/or currents) on the access lines and/or the data/sense lines. As an example, the decoding circuits may include row decoding circuits for decoding signals on the access lines, and column decoding circuits for decoding signals on the data/sense lines.

As used in the present disclosure, the term substrate material can include silicon-on-insulator (SOI) or silicon-on-sapphire (SOS) technology, doped and undoped semiconductors, epitaxial layers of silicon supported by a base semiconductor foundation, conventional metal oxide semiconductors (CMOS) (e.g., a CMOS front end with a metal backend) and/or other semiconductor structures and technologies. Various elements (e.g., transistors, and/or circuitry), such as decode circuitry for instance, associated with operating the array 201 can be formed in/on the substrate material such as via process steps to form regions or junctions in the base semiconductor structure or foundation.

The memory cells 207 can be formed using various processing techniques such as atomic material deposition (ALD), physical vapor deposition (PVD), chemical vapor deposition (CVD), supercritical fluid deposition (SFD), molecular beam expitaxy (MBE), patterning, etching, filling, chemical mechanical planarization (CMP), combinations thereof, and/or other suitable processes. In accordance with a number of embodiments of the present disclosure, materials may be grown in situ.

Figure 3:
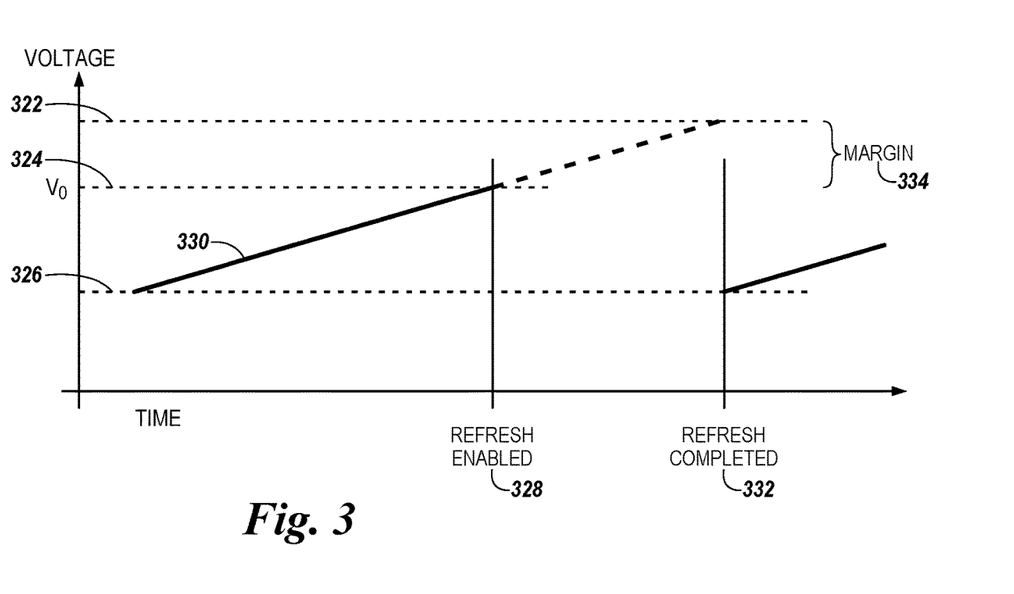
FIG. 3 illustrates a diagram associated with performing refresh in memory in accordance with a number of embodiments of the present disclosure.

FIG. 3 illustrates a diagram associated with performing refresh in memory in accordance with a number of embodiments of the present disclosure. The monitor circuitry (e.g., monitor circuitry 118 in FIG. 1B) can track the threshold voltage 330 of a portion of memory cells in the array of memory cells, (e.g., a monitor array of memory cells). Tracking the threshold voltage 330 of a portion of memory cells (e.g., the monitor array) can be executed via a controller configured to apply a current to the portion of the array of memory cells and measure a voltage associated with the portion of memory cells. The current can be applied during set periods of time (e.g., periodically) or can be applied continuously. The controller can be configured to refresh a portion of the memory cells in the array in response to the portion of memory cells (e.g., the monitor array) having a threshold voltage and/or threshold voltages that are greater than a reference voltage. Refreshing the array of memory cells can improve read margin of the array of memory cells.

The memory cells of the monitor array can be programmed to a particular data state (e.g., a first state voltage 326 or to a second state voltage 322, for example). In this example for illustration, the memory cells of the monitor array are initially programmed to a first state voltage 326. However, embodiments are not limited to memory cells initially programmed to a first state voltage 326. The controller (e.g., controller 114 in FIG. 1B) can refresh the array of memory cells in response to the memory cells in the monitor array having threshold voltages 330 that are greater than a reference voltage 324. The reference voltage 324 can be determined by the threshold voltage 330 being within a set margin 334 of the second state voltage 322 (e.g., a reference voltage for the second state). The set margin 334 can depend on the speed and the size of the memory device to have enough time to do a refresh operation before memory cells programmed to the first state 326 reach the second state voltage 322. When the threshold voltage 330 of memory cells in the monitor array reaches the reference voltage 324, a refresh operation can be enabled 328. A refresh operation can reprogram at least a portion of the array of memory cells to a data state which they were previously programmed. For example, memory cells programmed to state 326 and have their threshold voltage change over time, as show in in FIG. 3, can be programmed so their threshold voltage returns to state 326 during a refresh operation. When the refresh operation is completed 332, the memory cells of the array can be programmed to the state which they had been previously programmed. In this example, the memory cells in the array initially programmed to state 326 can be reprogrammed to a threshold voltage associated with the state 326. However, if the memory cells were initially programmed to state 322, the memory cells could be programmed to a threshold voltage associated with the state 322 during a refresh operation. In one or more embodiments, a first number of memory cells in the array can be programmed to the state 326 and/or a second number of memory cells in the array can be programmed to the state 322. During a refresh operation, the first number of memory cells in the array can be reprogrammed to the first state voltage 326 and/or the second number of memory cells can be reprogrammed to the second state voltage 322.

In one or more embodiments, the portion of memory cells that are being monitored can be within one or more monitor arrays. The memory cells in the monitor array can be connected in parallel via a bit line. In one or more embodiments the number of memory cells in the monitor array can depend on the reference voltage.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    an array of memory cells, organized in a cross point architecture, including a first portion and a second portion, wherein the first portion of the array of memory cells is a monitor array; and
    a controller configured to:
        program memory cells of the first portion of the array to a first state only via a select device, wherein a voltage associated with the first state is lower than a reference voltage;
        program memory cells of the second portion of the array to the first state and a second state via the select device, wherein a voltage associated with the second state is greater than the reference voltage, and wherein one or more threshold voltages of memory cells of the second portion of the array of memory cells programmed to the second state increase away from the reference voltage over time;
        enable a refresh operation of the first portion and the second portion of the array of memory cells via monitor circuitry in response to the first portion of the array of memory cells having one or more threshold voltages that increase to become within a set margin of the reference voltage; and
        complete the refresh operation on the first portion and the second portion of the array of memory cells before a threshold voltage of a memory cell of the second portion of the array of memory cells programmed to the first state reaches a voltage associated with the second state.

2. The apparatus of claim 1, wherein the controller is configured to refresh memory cells programmed to the first state.

3. The apparatus of claim 1, wherein the controller is configured to refresh memory cells programmed to the second state.

4. The apparatus of claim 1, wherein the controller is configured to refresh memory cells programmed to the first state and to the second state.

5. The apparatus of claim 1, wherein a current is applied to the first portion of the array of memory cells.

6. The apparatus of claim 5, wherein voltages of the first portion of the array of memory cells are measured after the current is applied.

7. The apparatus of claim 6, wherein the second portion of the memory cells in the array in response to the first portion of the array of memory cells in the array having threshold voltages that are greater than the reference voltage are refreshed.

8. An apparatus, comprising:
    an array of memory cells, organized in a cross point architecture, including a first number of memory cells and a second number of memory cells, wherein the first number of memory cells are included in a monitor array; and
    a controller coupled to the array of memory cells, configured to:
        program the first number of memory cells to a first state only via a select device, wherein a voltage associated with the first state is lower than a reference voltage;
        program the second number of memory cells to the first state and a second state via the select device, wherein a voltage associated with the second state is greater than the reference voltage, and wherein one or more threshold voltages of memory cells of the second portion of the array of memory cells programmed to the second state increase away from the reference voltage over time;
        measure a voltage associated with the first number of memory cells in the array of memory cells via monitor circuitry;
        enable a refresh operation of the first number of memory cells and the second number of memory cells via the monitor circuitry in response to the voltage associated with the first number of memory cells increasing to being within a set margin of the reference voltage; and
        complete the refresh operation before a threshold voltage of a memory cell of the second number of memory cells programmed to the first state reaches a voltage associated with the second state.

9. The apparatus of claim 8, wherein the first number of memory cells are on a bit line with first state cells.

10. The apparatus of claim 9, wherein the first number of memory cells are connected in parallel to the first state cells.

11. The apparatus of claim 8, wherein the size of the monitor array depends on the reference voltage.

12. An apparatus, comprising:
an array of memory cells, organized in a cross point architecture, including a first number of memory cells and a second number of memory cells, wherein the first number of memory cells are included in a monitor array; and
a controller coupled to the array of memory cells, configured to:
  program the first number of memory cells to a first state only via a select device, wherein a voltage associated with the first state is lower than a reference voltage;
  program the second number of memory cells to the first state and a second state via the select device, wherein a voltage associated with the second state is greater than the reference voltage, and wherein one or more threshold voltages of memory cells of the second portion of the array of memory cells programmed to the second state increase away from the reference voltage over time;
  apply a current to the first number of memory cells in the array of memory cells via the select device;
  measure a voltage associated with the first number of memory cells in the array of memory cells via monitor circuitry;
  enable a refresh operation of the first number of memory cells and the second number of memory cells via the monitor circuitry in response to the voltage associated with the first number of memory cells increasing to being within a set margin of the reference voltage; and
  complete the refresh operation before a threshold voltage of a memory cell of the second number of memory cells of the array of memory cells programmed to the first state reaches a voltage associated with the second state.

13. The apparatus of claim 12, wherein the apparatus includes another array of memory cells that store cell data during the refresh operation.

14. The apparatus of claim 12, wherein the controller includes a buffer that stores cell data during the refresh operation.

15. The apparatus of claim 12, wherein the memory array includes a buffer that stores cell data during a refresh operation.

16. A method, comprising:
programming a first number of memory cells in an array of memory cells to a first state only via a select device, wherein a voltage associated with the first state is lower than a reference voltage, and wherein the array of memory cells is organized in a cross point architecture;
programming a second number of memory cells in the array of memory cells to the first state and a second state via the select device, wherein a voltage associated with the second state is greater than the reference voltage, and wherein one or more threshold voltages of memory cells of the second portion of the array of memory cells programmed to the second state increase away from the reference voltage over time;
applying a current to the first number of memory cells in the array of memory cells via the select device, wherein the first number of memory cells are included in a monitor array;
measuring a voltage associated with the first number of memory cells in an array of memory cells via monitor circuitry;
enabling a refresh operation of the array of memory cells via the monitor circuitry in response to the voltage associated with the first number of memory cells increasing to being within a set margin of the reference voltage; and
completing the refresh operation of the array of memory cells before a threshold voltage of a memory cell of the second number of memory cells of the array of memory cells programmed to the first state reaches a voltage associated with a second state.

17. The method of claim 16, wherein the current is applied periodically.

18. The method of claim 16, wherein the current is applied continuously.

19. The method of claim 16, wherein refreshing the array of memory cells increases a read margin of the array of memory cells.

* * * * *